(12) United States Patent
Fujita et al.

(10) Patent No.: US 10,700,306 B2
(45) Date of Patent: Jun. 30, 2020

(54) LIGHT EMITTING APPARATUS

(71) Applicants: PIONEER CORPORATION, Kanagawa (JP); TOHOKU PIONEER CORPORATION, Yamagata (JP)

(72) Inventors: Koji Fujita, Yonezawa (JP); Shinsuke Tanaka, Yonezawa (JP); Yuji Saito, Yonezawa (JP); Shinji Nakajima, Yonezawa (JP)

(73) Assignee: PIONEER CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/378,274

(22) Filed: Apr. 8, 2019

(65) Prior Publication Data
US 2019/0237700 A1 Aug. 1, 2019

Related U.S. Application Data

(63) Continuation of application No. 15/960,151, filed on Apr. 23, 2018, now Pat. No. 10,297,788, which is a
(Continued)

(51) Int. Cl.
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3283* (2013.01);
(Continued)

(58) Field of Classification Search
CPC ..... H01L 2251/5323; H01L 2251/5361; H01L 27/3246; H01L 27/3283; H01L 51/5203; H01L 51/5237; H01L 51/5253
(Continued)

(56) References Cited

U.S. PATENT DOCUMENTS 7,902,755 B2  3/2011  Kubota
7,931,516 B2  4/2011  Aota
(Continued)

FOREIGN PATENT DOCUMENTS

JP  2002-093576 A  3/2002
JP  2002-093586 A  3/2002
(Continued)

OTHER PUBLICATIONS

Japanese Office Action for JP Application No. 2018-012695, dated Jun. 25, 2019, 6 pages.
(Continued)

*Primary Examiner* — Long K Tran
(74) *Attorney, Agent, or Firm* — Procopio, Cory, Hargreaves & Savitch LLP.

(57) ABSTRACT

A light emitting apparatus (10) includes a substrate (100), an insulating layer (160), a light emitting element (102), a coating film (140), and a structure (150). The insulating layer (160) is formed over one surface of the substrate (100), and includes an opening (162). The light emitting element (102) is formed in the opening (162). The coating film (140) is formed over the one surface of the substrate (100), and covers a portion of the light emitting element (102), the insulating layer (160), and the one surface of the substrate (100). The coating film (140) does not cover another portion of the substrate (100) (for example, a portion of an end portion: hereinafter, referred to as a first portion). The structure (150) is located between the first portion of the substrate (100) and the insulating layer (160). The coating film (140) also covers the insulating layer (160).

8 Claims, 11 Drawing Sheets

Related U.S. Application Data continuation of application No. 15/125,930, filed as application No. PCT/JP2014/056731 on Mar. 13, 2014, now Pat. No. 9,978,986.

(52) U.S. Cl.
CPC ...... *H01L 51/5203* (2013.01); *H01L 51/5237* (2013.01); *H01L 2251/5323* (2013.01); *H01L 2251/5361* (2013.01)

(58) Field of Classification Search
USPC .......................................................... 257/40
See application file for complete search history.

(56) References Cited

U.S. PATENT DOCUMENTS

| | | | |
|---|---|---|---|
| 8,159,127 | B2 | 4/2012 | Izumi |
| 2008/0079360 | A1 | 4/2008 | Kubota |
| 2009/0021154 | A1 | 1/2009 | Aota |
| 2010/0176720 | A1* | 7/2010 | Yamazaki ........... H01L 27/3246 313/509 |
| 2010/0295759 | A1 | 11/2010 | Tanaka |
| 2010/0320909 | A1 | 12/2010 | Izumi |
| 2014/0300270 | A1 | 10/2014 | Sakamoto |

FOREIGN PATENT DOCUMENTS

| | | |
|---|---|---|
| JP | 2003208975 A | 7/2003 |
| JP | 2008091237 A | 4/2008 |
| JP | 2009049001 A | 3/2009 |
| JP | 2010272270 A | 12/2010 |
| JP | 2011008969 A | 1/2011 |
| JP | 2012-150901 A | 8/2012 |
| JP | 2013097917 A | 5/2013 |
| WO | 2014017075 A1 | 1/2014 |
| WO | 2014020899 A2 | 2/2014 |

OTHER PUBLICATIONS

International Search Report for PCT App No. PCT/JP2014/056731 dated Jun. 24, 2014, 5 pgs.
Decision of Rejection for KR App No. 10-2016-7028272 dated Feb. 5, 2018, 9 pgs.
Decision of Rejection for JP App No. 2016/507206 dated Nov. 7, 2017, 30 pgs.
Office Action for related JP App. No. 2018-012695 dated Jan. 14, 2020; 8 pages.

* cited by examiner

LIGHT EMITTING APPARATUS

CROSS-REFERENCE TO RELATED APPLICATIONS

This application is a continuation application of U.S. patent application Ser. No. 15/960,151, filed on Apr. 23, 2018, which is a continuation application of U.S. patent application Ser. No. 15/125,930, filed on Sep. 13, 2016, now patented as U.S. Pat. No. 9,978,986 which is a U.S. National Stage entry of PCT Application No. PCT/JP2014/056731, filed on Mar. 13, 2014, the contents of which are incorporated by reference.

TECHNICAL FIELD

The present invention relates to a light emitting apparatus.

BACKGROUND ART

In recent years, there has been progress in the development of light emitting apparatuses using an organic EL element as a light source. In the organic EL element, an organic layer is used as a light emitting layer, and thus a sealing structure is required. Generally, the organic EL element is sealed using a sealing member which is formed of glass, a metal or the like. A terminal which is connected to the organic EL element is disposed outside of this sealing member.

On the other hand, Patent Document 1 discloses that an organic EL element is sealed by forming a sealing film using an atomic layer deposition (ALD) method. Patent Document 1 discloses that, since stress is easily concentrated on a portion having an inverse-tapered shape such as a partition wall, a crack tends to occur in the sealing film.

RELATED DOCUMENT

Patent Document

[Patent Document 1] Japanese Unexamined Patent Application Publication No. 2013-097917

SUMMARY OF THE INVENTION

In a case where a light emitting element such as an organic EL element is sealed by coating the element with a film, a crack may progress from an end portion of the film toward the inner side of the film. Such a crack reaching an insulating layer surrounding the light emitting element gives rise to the possibility of a decrease in the sealing characteristics. The decrease in the sealing characteristics causes gas (for example, oxygen) or moisture that deteriorates the light emitting element to infiltrate from the crack and reach the light emitting element through the insulating layer.

The exemplary problem to be solved by the present invention is to suppress deterioration in a light emitting element covered with a coating film caused by a crack in the coating film, despite the crack progressing from an end portion of the coating film toward the inner side of the coating film.

According to the invention of claim 1, there is provided a light emitting apparatus including: a substrate; an insulating layer formed over the substrate and including an opening; a light emitting element formed in the opening; and a coating film formed over the substrate and covers a portion of the light emitting element, the insulating layer, and the substrate. The coating film does not cover a first portion of the substrate which is a portion of a region not covered with the insulating layer, the apparatus further includes a structure which is located between the first portion and the insulating layer, and the coating film covers the structure.

BRIEF DESCRIPTION OF THE DRAWINGS

The above-mentioned objects, other objects, features and advantages will be made clearer from the preferred embodiment described below, and the following accompanying drawings.

DESCRIPTION OF EMBODIMENTS

Hereinafter, an embodiment of the present invention will be described with reference to the accompanying drawings. In all the drawings, like elements are referenced by like reference numerals and the descriptions thereof will not be repeated.

Figure 1:
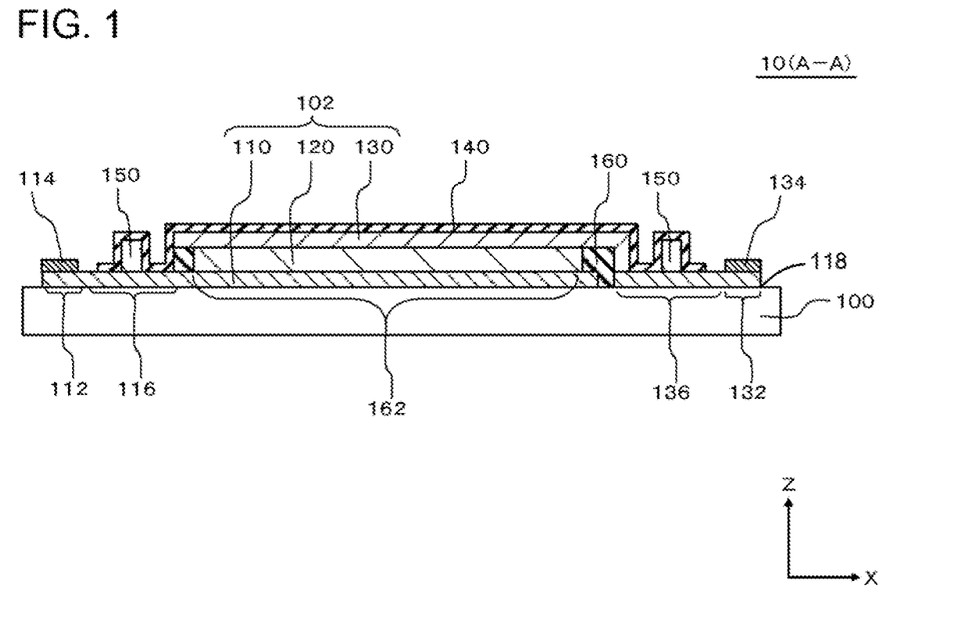
FIG. 1 is a cross-sectional view illustrating a configuration of a light emitting apparatus according to an embodiment.
Figure 2:
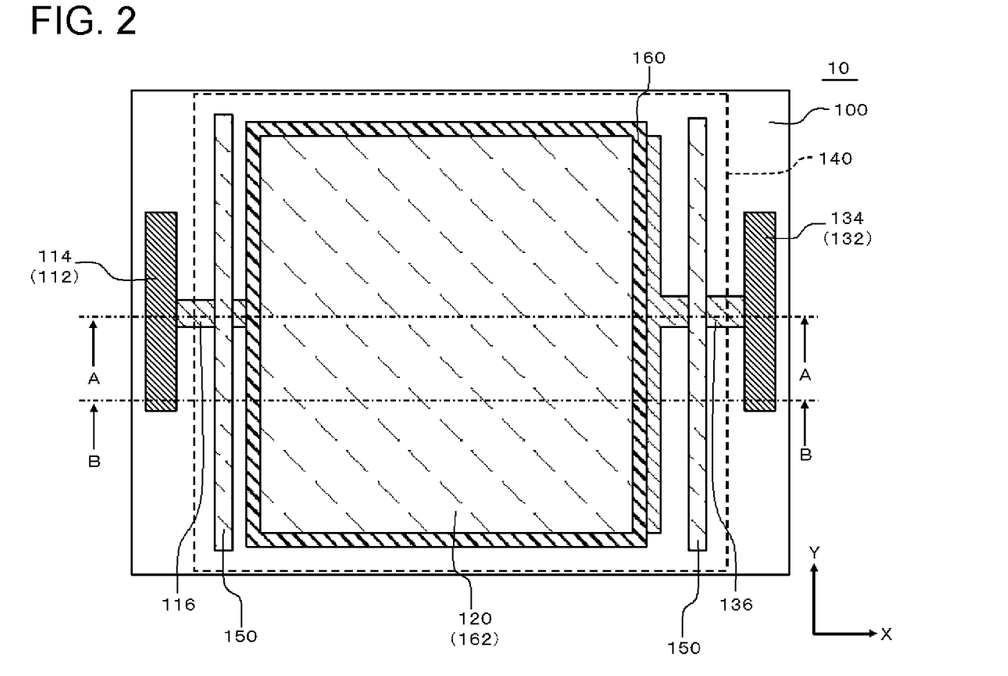
FIG. 2 is a plan view of the light emitting apparatus shown in FIG. 1.
Figure 3:
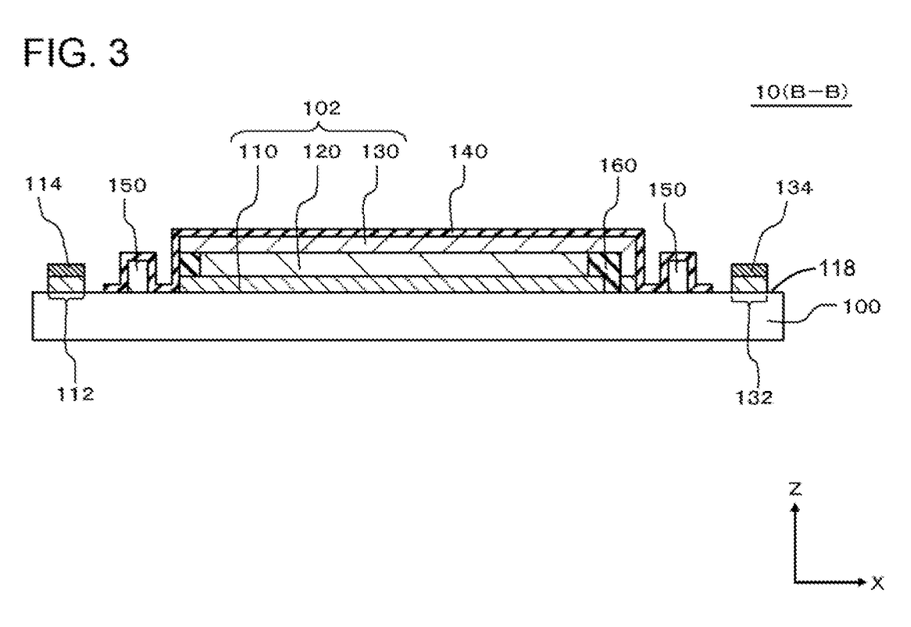
FIG. 3 is a cross-sectional view taken along line B-B of FIG. 2.

FIG. 1 is a cross-sectional view illustrating a configuration of a light emitting apparatus 10 according to an embodiment. FIG. 2 is a plan view of the light emitting apparatus 10 shown in FIG. 1. FIG. 1 is a cross-sectional view taken along line A-A of FIG. 2. FIG. 3 is a cross-sectional view taken along line B-B of FIG. 2.

The light emitting apparatus 10 according to the embodiment is, for example, an illumination device or a display, and includes a substrate 100, an insulating layer 160, a light emitting element 102, a coating film 140, and a structure 150. The insulating layer 160 is formed over one surface of the substrate 100, and includes an opening 162. The light emitting element 102 is formed in the opening 162. The coating film 140 is formed over the above-described one surface of the substrate 100, and covers the light emitting element 102, the insulating layer 160, and a portion of the one surface of the substrate 100. The coating film 140 does not cover another portion of the substrate 100 (for example, a portion of an end: hereinafter, referred to as a first portion). The structure 150 is located between the first portion of the substrate 100 and the insulating layer 160. The coating film 140 also covers the insulating layer 160. The light emitting element 102 is, for example, an organic EL element. Hereinafter, a detailed description will be given.

The substrate 100 is a transparent substrate such as, for example, a glass substrate or a resin substrate. The substrate 100 may have flexibility, in, this case, the thickness of the substrate 100 is, for example, equal to or greater than 10 μm and equal to or less than 1,000 μm. Even in this case, the substrate 100 may be formed of any of an inorganic material and an organic material. The substrate 100 has a polygonal shape such as, for example, a rectangular shape. Meanwhile, in a case where the substrate 100 is a resin substrate, an inorganic material film 118 such as a silicon oxide film is formed on a surface of the substrate 100 which has the light emitting element 102 formed thereon. Thereby, it is possible to prevent moisture or the like from passing through the substrate 100 and reaching the light emitting element 102.

The insulating layer 160 is formed over the substrate 100. The insulating layer 160 includes the opening 162. The light emitting element 102 is formed in the opening 162. In other words, a region in which the light emitting element 102 is to be formed is partitioned. The insulating layer 160 is formed of a material such as polyimide, a silicon oxide, or a silicon nitride.

The light emitting element 102 has a configuration in which an organic layer 120 is interposed between a first electrode 110 and a second electrode 130. At least one of the first electrode 110 and the second electrode 130 is configured as a light-transmitting electrode. In addition, the remaining electrode is formed of a metal layer made of a metal selected from a first group consisting of, for example, Al, Mg, Au, Ag, Pt, Sn, Zn, and In, or an alloy of metals selected from this first group. The light-transmitting electrode is a mesh-like electrode using, for example, an inorganic material such as an indium tin oxide (ITO) or an indium zinc oxide (IZO), a conductive polymer such as a polythiophene derivative, or a nanowire made of silver or carbon. For example, in a case where a bottom-emission type light emitting element 102 has a configuration in which the first electrode 110, the organic layer 120, and the second electrode 130 are laminated on the substrate 100 in this order, the first electrode 110 is configured as a light-transmitting electrode, and the second electrode 130 is configured as an Al electrode or the like which reflects light. In addition, in a case where a top-emission type light emitting element 102 has a configuration in which the first electrode 110, the organic layer 120, and the second electrode 130 are laminated on the substrate 100 in this order, the first electrode 110 is configured as an Al electrode or the like which reflects light, and the second electrode 130 is configured as a light-transmitting electrode. In addition, a light-transmitting type light emitting apparatus may be configured (dual-emission type apparatus) with both the electrodes (first electrode 110 and second electrode 130) being light-transmitting electrodes.

The organic layer 120 has a configuration in which, for example, a hole transport layer, a light emitting layer, and an electron transport layer are laminated in this order. A hole injection layer may be formed between the hole transport layer and the first electrode 110. In addition, an electron injection layer may be formed between the electron transport layer and the second electrode 130. The organic layer 120 may be formed by a coating method, and may be formed by a vapor deposition method. A portion of the layer may be formed by the coating method, and the remainder may be formed by the vapor deposition method. Meanwhile, the organic layer 120 may be formed by the vapor deposition method using a vapor deposition material, and the organic layer 120 may be formed by an ink jet method, a printing method, or a spray method using a coating material.

Terminals 112 and 132 are formed on a surface of the substrate 100 which has the light emitting element 102 formed thereon. The terminal 112 is electrically connected to the first electrode 110, and the terminal 132 is electrically connected to the second electrode 130. Specifically, a portion of the first electrode 110 does not have the organic layer 120 formed thereon and is located outside the insulating layer 160. This portion serves as the terminal 112. In addition, the terminal 132 has the same layer as that of the first electrode 110. In the example shown in FIG. 1, the terminal 112 is connected to the first electrode 110 through an interconnect 116, and the terminal 132 is connected to the second electrode 130 through an interconnect 136. Both the interconnects 116 and 136 have the same layer as that of the first electrode 110.

In the example shown in FIG. 1, the terminal 112 has a configuration in which a second layer 114 is laminated on the first electrode 110. In addition, the terminal 132 has a configuration in which a second layer 134 is laminated on the same layer as that of the first electrode 110. The second layers 114 and 134 are formed of a material having a lower resistance than a material of which the first electrode 110 is formed, for example, a metal. The second layers 114 and 134 have a configuration in which, for example, Mo, Al, and Mo are laminated in this order. Meanwhile, other metals may be added to Mo or Al. Meanwhile, the second layers 114 and 134 may also be formed on at least a portion of the interconnects 116 and 136. However, it is not necessary that the second layers 114 and 134 are formed on the terminals 112 and 132.

The coating film 140 is formed using a film formation method, for example, an ALD method or a CVD method. In a case where the coating film is formed using the ALD method, the coating film 140 is formed of a film of a metal oxide such as, for example, an aluminum oxide, and the film thickness is, for example, equal to or greater than 10 nm and equal to or less than 200 nm, preferably, equal to or greater than 50 nm and equal to or less than 100 nm. In a case where the coating film is formed using the CVD method, the coating film 140 is formed of an inorganic insulating film such as a silicon oxide film, and the film thickness is, for example, equal to or greater than 0.1 μm and equal to less than 10 μm. By providing the coating film 140, the light emitting element 102 is protected from moisture or the like. The coating film 140 may be formed using a sputtering method. In this case, the coating film 140 is formed of an insulating film such as $SiO_2$ or SiN. In that case, the film thickness is equal to or greater than 10 nm and equal to or less than 1,000 nm.

The aforementioned terminals 112 and 132 are formed close to the edge of the substrate 100. The coating film 140 is not formed in a portion of the edge of the substrate 100 which is located close to the terminals 112 and 132. Thus, the terminals 112 and 132 are not covered with the coating film 140. The structure 150 is formed between the insulating layer 160 and a portion of the substrate 100 which is not covered with the coating film 140. In the example shown in FIG. 1, the structure 150 is formed at each of locations between the terminal 112 and the insulating layer 160, and between the terminal 132 and the insulating layer 160.

The structure 150 is formed of an insulator such as a resin or an inorganic material. In a case where the structure 150 is formed of a photosensitive material, the structure 150 is formed by applying the above-described material onto the substrate 100 to form a layer, and then exposing and developing this layer. In addition, in a case where the structure 150 is formed of an inorganic material, the structure 150 is formed by forming a layer to be the structure 150 using the CVD method or the sputtering method, and then selectively removing this layer.

The structure 150 extends in a first direction (Y direction of FIG. 2). The structure 150 is longer than the insulating layer 160 in the first direction. In the example shown in FIG. 2, the structure 150 is formed so as to traverse the interconnect 116 or the interconnect 136. For this reason, the structure 150 has a portion that comes into contact with the substrate 100 and a portion that comes into contact with the interconnect 116 or the interconnect 136 on the lower surface thereof.

As shown in FIG. 3, in the vicinity of the portion in which the lower surface of the structure 150 comes into contact with the substrate 100, the coating film 140 comes into contact with the substrate 100 in a portion (second portion) of the substrate 100 which is located between the structure 150 and the terminal 112 and a portion (third portion) of the substrate 100 which is located between the structure 150 and the insulating layer 160. In a case where the coating film 140 is formed of an inorganic material, joining between the substrate 100 and the coating film 140 is configured as joining between inorganic materials, and thus is stronger than joining between the coating film 140 and the insulating layer 160.

Next, a method of manufacturing the light emitting apparatus 10 will be described. First, the first electrode 110 and the terminals 112 and 132 are formed on the substrate 100. The first electrode 110 and the terminals 112 and 132 are formed using, for example, the vapor deposition method or the sputtering method. Next, the insulating layer 160 is formed so as to cover the periphery of the first electrode 110 (see FIG. 2). Then, the organic layer 120 is formed on the first electrode 110. In addition, the structure 150 is formed.

Next, the second electrode 130 is formed, and the coating film 140 is further formed. The second electrode 130 is formed using, for example, the sputtering method or the vapor deposition method, and the coating film 140 is formed using, for example, the ALD method or the CVD method.

Figure 4:
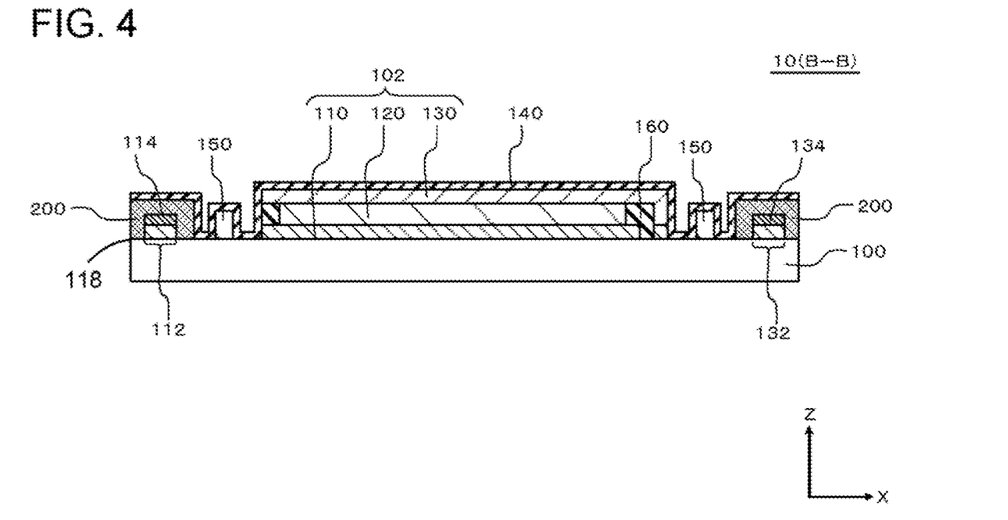
FIG. 4 is a cross-sectional view illustrating a method of forming a region on a substrate which is not covered with a coating film.

FIG. 4 is a cross-sectional view illustrating a method of forming a region which is not covered with the coating film 140, on the substrate 100. As described above, the coating film 140 does not cover the terminals 112 and 132. In order to achieve this, a region of the substrate 100 which has the terminals 112 and 132 formed therein is covered with a lift-off layer 200, for example, before the coating film 140 is formed. The lift-off layer 200 is formed of, for example, an organic material. The glass transition temperature or phase transition temperature (for example, melting point) of the lift-off layer 200 is lower than the glass transition temperature or phase transition temperature (for example, melting point) of the coating film 140. Meanwhile, it is preferable that the linear expansion coefficient of the material constituting the lift-off layer 200 is larger than the linear expansion coefficient of the material constituting the coating film 140.

After the coating film 140 is formed, the substrate 100 is heated and cooled. At this time, a crack is generated in a portion of the coating film 140 which is located above the lift-off layer 200. When the vicinities of the terminal 112 and the terminal 132 are cleaned by a solution for dissolving the lift-off layer 200, this solution comes into contact with the lift-off layer 200 through the crack generated in the coating film 140, and the lift-off layer 200 is removed. In this case, an upper portion of the lift-off layer 200 is removed.

A crack may be generated in the end portion of the coating film 140. Such a crack is generated, for example, in the aforementioned process of removing the lift-off layer 200, or when an anisotropic conductive film, or a conductive member such as a lead terminal or a bonding wire is connected to the terminals 112 and 132. When a crack is generated in the end portion of the coating film 140, the crack progresses toward the light emitting element 102. On the other hand, in the present embodiment, the structure 150 is formed between the insulating layer 160 and a region of the substrate 100 in which the coating film 140 is not formed. The structure 150 extends in the first direction (Y direction of FIG. 2), and thus the progressing direction of the crack in a second direction (X direction of FIG. 2) intersecting the first direction is changed to the first direction. Therefore, it is possible to prevent the crack generated in the coating film 140 from progressing to the light emitting element 102. Thereby, it is possible to prevent gas (for example, oxygen) or moisture deteriorating the light emitting element from reaching the light emitting element.

Particularly, in a case where an outer lateral side of the insulating layer 160 (that is, the lateral side located opposite to the opening 162) is inclined in a direction in which the lower surface of the insulating layer 160 widens, the crack of the coating film 140 reaching the edge of the insulating layer 160 causes moisture, gas or the like to quickly advance to the light emitting element 102 through the insulating layer 160. Even in such a case, in the present embodiment, since the structure 150 is provided, it is possible to suppress deterioration in the light emitting element 102 caused by the crack generated in the coating film 140. In other words, it is possible to maintain the sealing properties of the light emitting apparatus 10.

In addition, the crack having reached the structure 150 may progress in a direction in which the structure 150 extends. Even in such a case, in the example shown in this drawing, the length of the structure 150 is larger than the width of the insulating layer 160 in the first direction (Y direction of FIG. 2). Even in a case where the crack having its course changed in the second direction (X direction of FIG. 2) is assumed to progress throughout the length of structure 150, the length of the structure 150 is larger than the width of the insulating layer 160, and thus it is possible to further suppress the progress of the crack generated in the coating film 140 to the insulating layer 160.

In addition, the coating film 140 comes into contact with the substrate 100 in a portion (second region) of the substrate 100 which is located between the structure 150 and the terminal 112, and a portion (third region) of the substrate 100 which is located between the structure 150 and the insulating layer 160. For this reason, in the second region and the third region, the crack of the coating film 140 is not likely to progress. Therefore, progress of the crack generated in the coating film 140 to the insulating layer 160 can be suppressed, and deterioration of the light emitting element 102 due to gas or moisture infiltrating from this crack can be further suppressed.

EXAMPLES

Example 1

Figure 5:
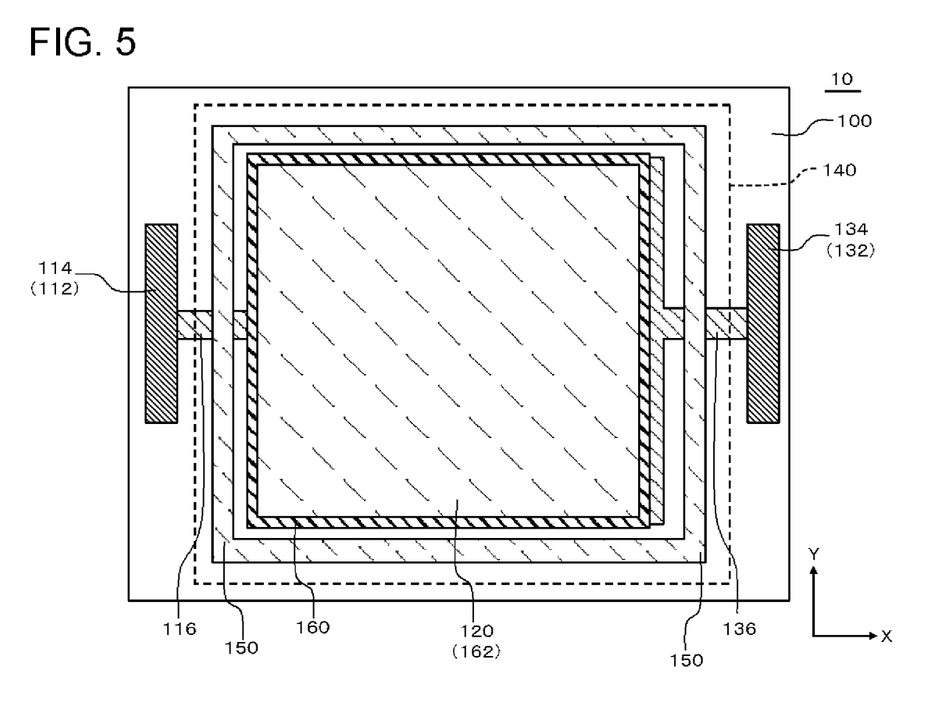
FIG. 5 is a plan view illustrating a configuration of a light emitting apparatus according to Example 1.

FIG. 5 is a plan view illustrating a configuration of a light emitting apparatus 10 according to Example 1, and corresponds to FIG. 2 in the embodiment. The light emitting apparatus 10 according to the present example has the same configuration as that of the light emitting apparatus 10 according to the embodiment, except for the following points.

First, the edge of the coating film 140 is located further inside the substrate 100 than the edge of the substrate 100 throughout the entire circumference of the coating film 140. The structure 150 surrounds the entire circumference of the insulating layer 160.

Figure 6:
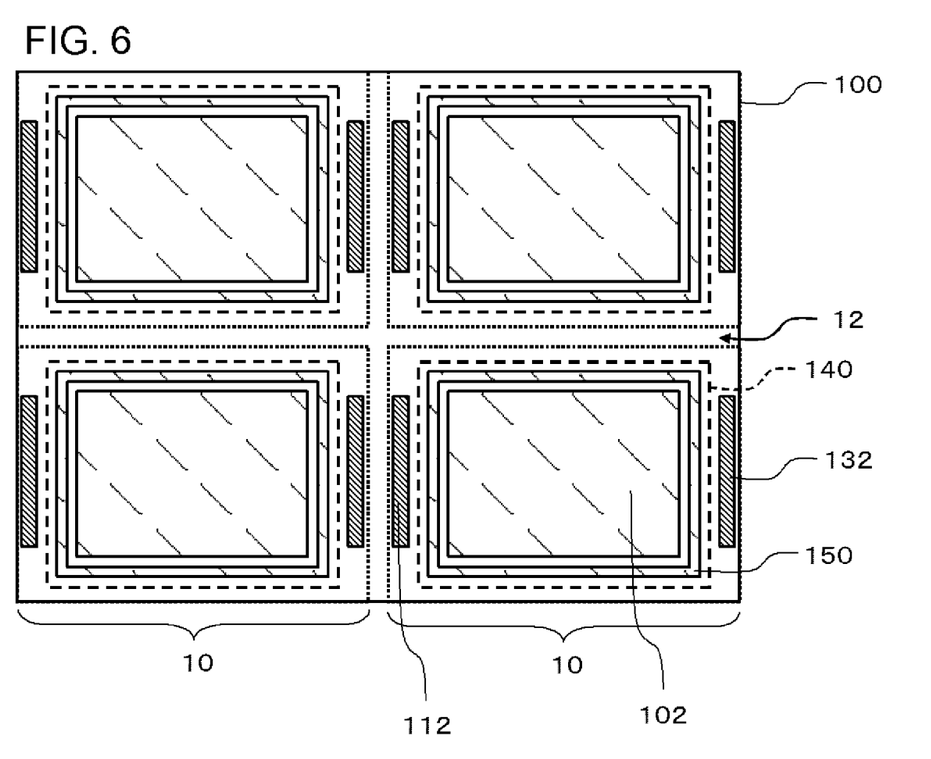
FIG. 6 is a plan view illustrating a method of manufacturing the light emitting apparatus according to Example 1.

FIG. 6 is a plan view illustrating a method of manufacturing the light emitting apparatus 10 according to the present example. In the present example, a plurality of light emitting apparatuses 10 are simultaneously formed in a state where the substrates 100 are connected to each other. After the coating film 140 is formed, the plurality of light emitting apparatuses 10 are cut off from each other using a dicing blade or the like. As an example, in a case where the coating film 140 is formed in a scribe line 12, there is the possibility of a large crack being generated in the coating film 140 when the light emitting apparatuses 10 are cut off from each other. For this reason, it is preferable that the coating film 140 is formed away from the scribe line 12 throughout the entire circumference thereof. Specifically, before the coating film 140 is formed, the lift-off layer 200 is applied to the scribe line 12 and the proximity thereof.

Here, the structure 150 is formed so as to surround the entire circumference of the insulating layer 160. Therefore, even in a case where a crack is generated in any portion of the edge of the coating film 140, it is possible to suppress deterioration in the light emitting element 102 caused by the crack.

Example 2

Figure 7:
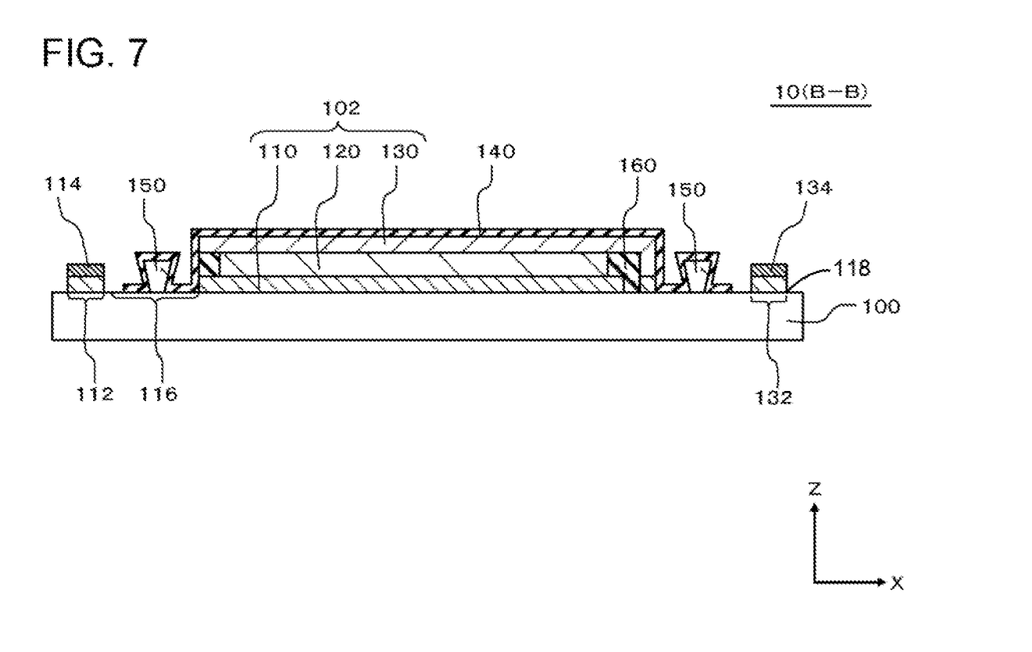
FIG. 7 is a cross-sectional view illustrating a configuration of a light emitting apparatus according to Example 2.

FIG. 7 is a cross-sectional view illustrating a configuration of a light emitting apparatus 10 according to Example 2, and corresponds to FIG. 3 in the embodiment. The light emitting apparatus 10 according to the present example has the same configuration as that of the light emitting apparatus 10 according to the embodiment or Example 1, except for the cross-sectional shape of the structure 150.

In the present example, the upper surface of the structure 150 is larger in width than the lower surface of the structure 150, in the cross-section of the structure 150 in the width direction (second direction). Specifically, the cross-section of the structure 150 is formed in a trapezoidal shape of which the upper base is longer than the lower base thereof. Such a structure can be obtained by controlling conditions when the structure 150 is formed (for example, exposure conditions in a case where the structure 150 is formed of a photosensitive material).

In the present example, it is also possible to prevent a crack generated in the edge of the coating film 140 from reaching the light emitting element 102. In addition, since the lateral side of the structure 150 is inclined so that the width of the structure 150 is wider at the top, the course of the crack can be easily changed from the first direction (Y direction of FIG. 2) to the second direction (X direction of FIG. 2). Therefore, it is possible to suppress deterioration in the light emitting element 102 caused by the crack generated in the edge of the coating film 140.

Example 3

Figure 8:
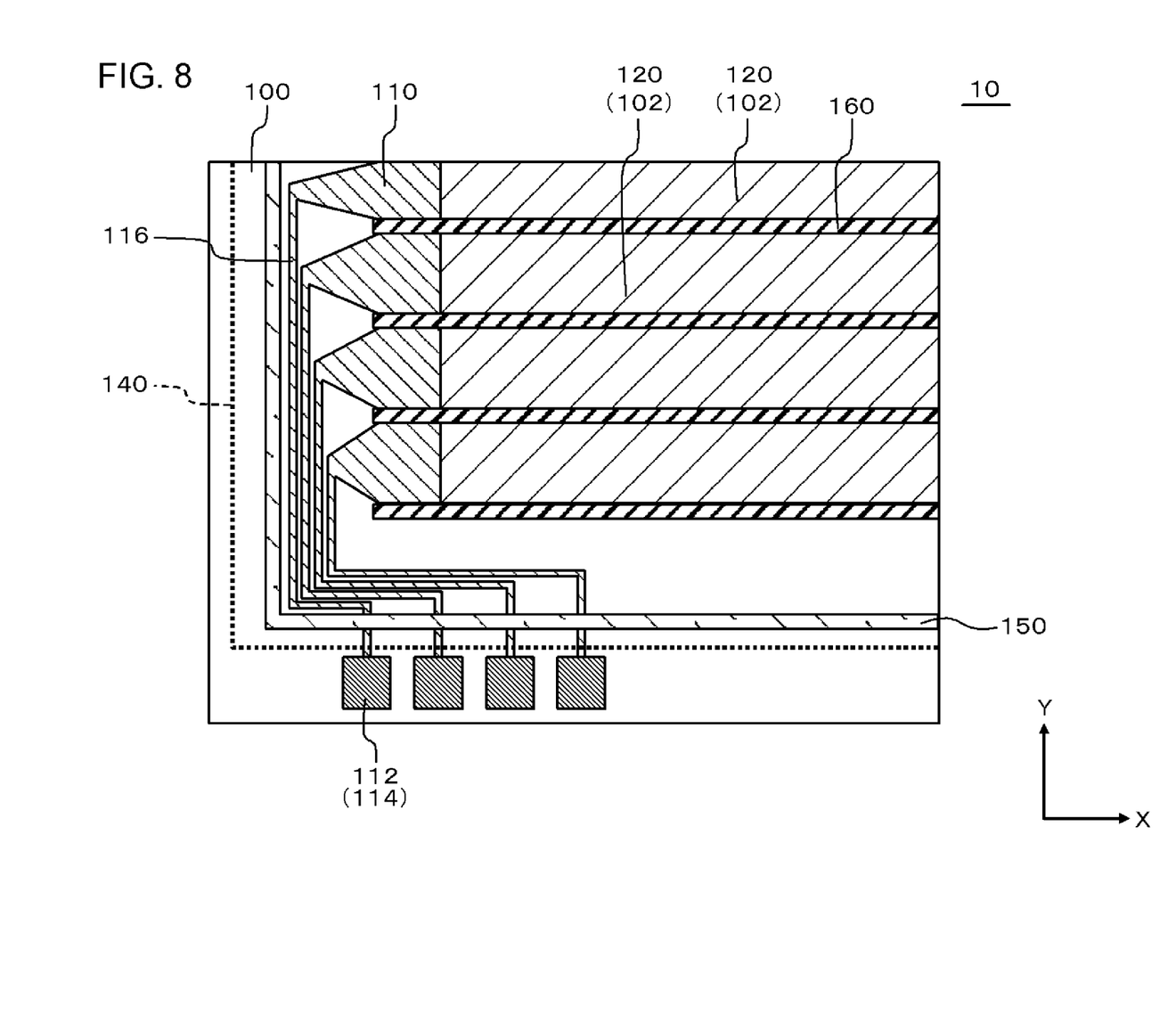
FIG. 8 is a plan view illustrating a configuration of a light emitting apparatus according to Example 3.

FIG. 8 is a plan view illustrating a configuration of a light emitting apparatus 10 according to Example 3. The light emitting apparatus 10 according to the present example has the same configuration as that of the light emitting apparatus 10 according to Example 1, except for the following points. Meanwhile, in FIG. 8, the second electrode 130 and the terminal 132 are not shown for the purpose of description.

In the present example, the light emitting apparatus 10 includes a plurality of light emitting elements 102. An insulating layer 160 is formed between the light emitting elements 102 adjacent to each other. Terminals 112 electrically connected to the respective plurality of light emitting elements 102 are formed. The plurality of terminals 112 are aligned with each other, and are disposed on the edge of the substrate 100. All the terminals 112 are exposed from the coating film 140. The structure 150 surrounds the entire circumference of a region having the plurality of light emitting elements 102 formed therein. The cross-sectional shape of the structure 150 may be the same shape as that in Example 2.

Meanwhile, the terminal 132 is also disposed similarly to the terminal 112.

In the present example, it is also possible to prevent a crack generated in the edge of the coating film 140 from reaching the light emitting elements 102.

Example 4

Figure 9:
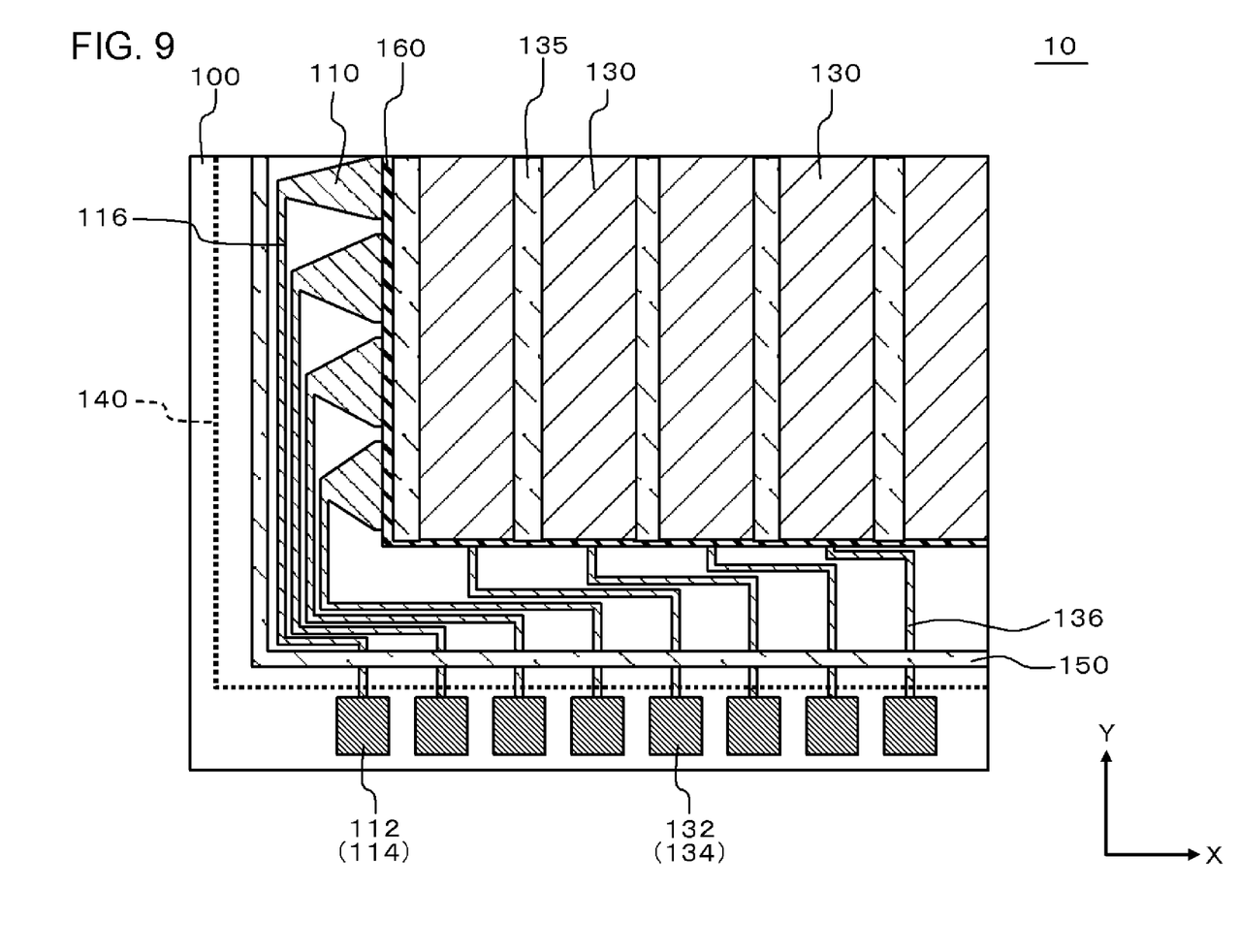
FIG. 9 is a plan view illustrating a configuration of a light emitting apparatus according to Example 4.
Figure 10:
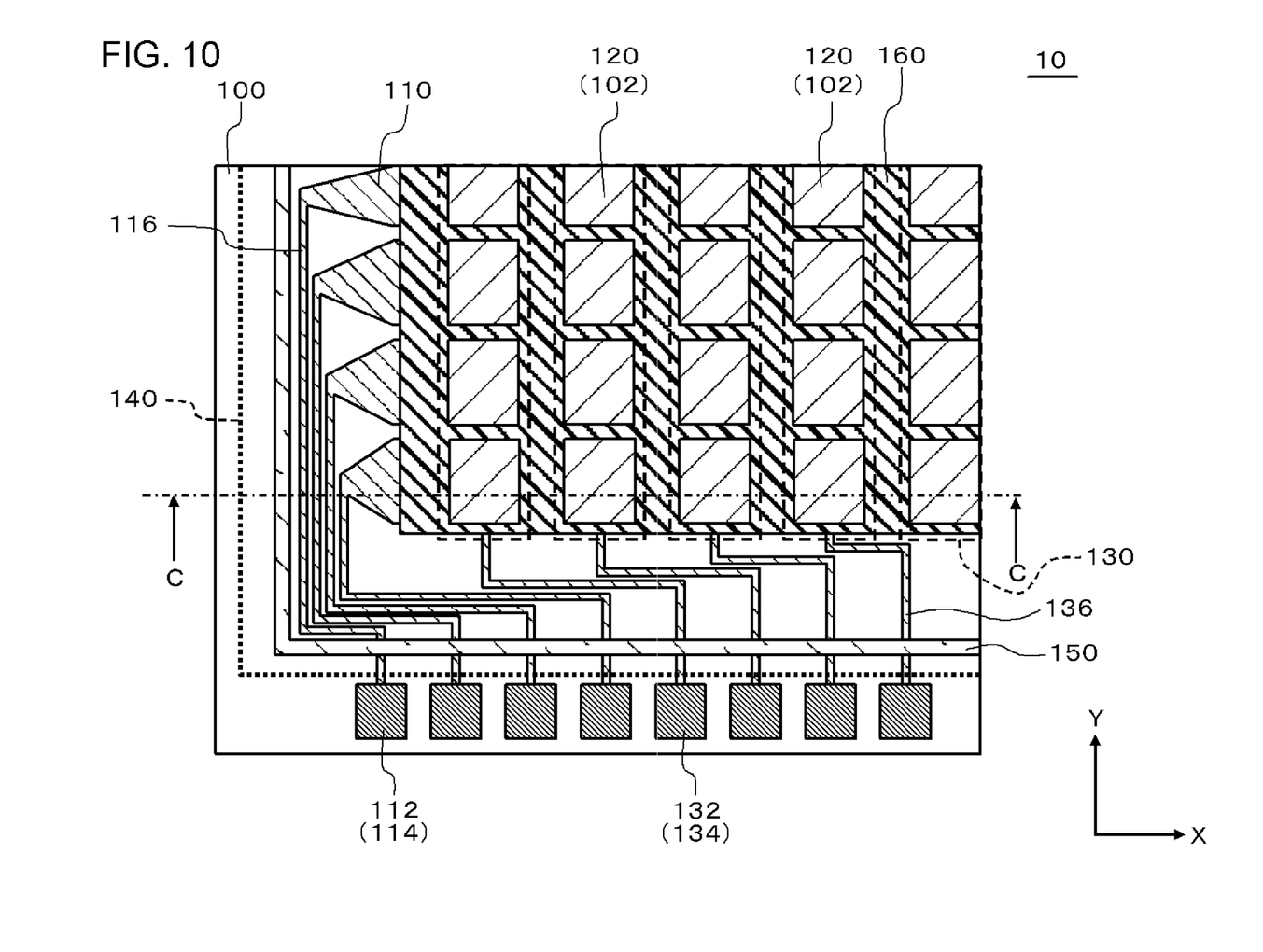
FIG. 10 is a diagram in which second electrodes and partition walls are removed from FIG. 9.
Figure 11:
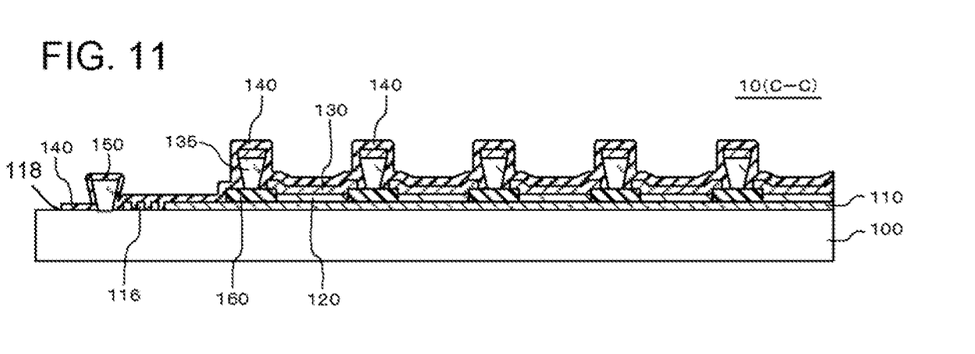
FIG. 11 is a cross-sectional view taken along line C-C of FIG. 9.

FIG. 9 is a plan view illustrating a configuration of a light emitting apparatus 10 according to Example 4. FIG. 10 is a diagram in which the second electrodes 130 and partition walls 135 are removed from FIG. 9. In FIG. 10, the second electrodes 130 are shown by a dotted line for the purpose of description. FIG. 11 is a cross-sectional view taken along line C-C of FIG. 10. FIG. 10 corresponds to FIG. 8 in Example 3. The light emitting apparatus 10 according to the present example has the same configuration as that of the light emitting apparatus 10 according to Example 3, except for the following points.

In the present example, the light emitting apparatus 10 is a display, and includes a plurality of light emitting elements 102 disposed in a matrix. The structure 150 surrounds the plurality of light emitting elements 102 collectively. The cross-sectional shape of the structure 150 may be the same shape as that in Example 2.

Specifically, a plurality of first electrodes 110 extend in parallel to each other, and a plurality of second electrodes 130 extend in parallel to each other and in a direction intersecting the first electrode 110 (for example, a direction orthogonal to the first electrode 110). The light emitting element 102 is formed at each of the points of intersection between the first electrodes 110 and the second electrodes 130. Specifically, the insulating layer 160 is formed over the plurality of first electrodes 110. An opening is formed in a portion of the insulating layer 160 which is located at the point of intersection between the first electrode 110 and the second electrode 130. An organic layer 120 is provided within this opening. That is, the light emitting element 102 is formed in the opening of the insulating layer.

The terminals 112 are electrically connected to the respective plurality of first electrodes 110, and the terminals 132 are electrically connected to the respective plurality of second electrodes 130. The plurality of terminals 112 and 132 are all disposed along the edge of the substrate 100. In the example shown in FIG. 9, the plurality of terminals 112 and 132 are all disposed along the same side of the substrate 100. However, the terminals 112 and the terminals 132 may be disposed along the sides of the substrate 100 which are different from each other.

In addition, a partition wall 135 is formed on the insulating layer 160. The partition wall 135 is located between the plurality of second electrodes 130. The cross-section of the partition wall 135 is trapezoidal with the upper base being longer than the lower base thereof. A conductive layer made of the same material as that of the second electrode 130 is formed on the upper surface of the partition wall 135. When the second electrode 130 is formed using the vapor deposition method or the sputtering method, the partition wall 135 is provided in order to separate adjacent second electrodes 130 from each other. For this reason, the partition wall 135 is formed after the insulating layer 160 is formed and before the partition wall 135 is formed (preferably, before the organic layer 120 is formed).

In the present example, the structure 150 is formed in the same process as the partition wall 135. For this reason, the structure 150 is formed of the same material as that of the partition wall 135, and the cross-section of the structure 150 is also formed in a trapezoidal shape of which the upper base is longer than the lower base thereof. The structure 150 and the partition wall 135 are formed of, for example, a photosensitive material, and are formed in the aforementioned cross-sectional shape by controlling exposure conditions.

In the present example, it is also possible to prevent a crack generated in the edge of the coating film 140 from reaching the light emitting element 102. In addition, since the structure 150 is formed in the same process as the partition wall 135, it is possible to reduce the number of processes of manufacturing the light emitting apparatus 10. As a result, it is possible to cut the manufacturing cost of the light emitting apparatus 10. The cross-sectional shape of the structure 150 is formed in a trapezoidal shape, and thus the traveling direction of a crack is easily changed (changed from the first direction to the second direction).

As described above, although the embodiment and examples have been set forth with reference to the accompanying drawings, they are merely illustrative of the present invention, and various configurations other than those stated above can be adopted.

The invention claimed is:

1. A light emitting device comprising:
   a substrate comprising a continuous inorganic film formed directly on a surface of the substrate;
   an insulating layer located over the substrate and comprising an opening;
   a light emitting element located in the opening;
   a coating film located over the substrate and covering the light emitting element, the insulating layer, and a portion of the substrate; and
   a plurality of interconnects electrically connected to the light emitting element,
   wherein the substrate comprises a first portion that is a portion of a region not covered by the insulating layer, and the first portion of the substrate is not covered by the coating film,
   the light emitting device further comprising a structure located between the first portion and the insulating layer,
   wherein the coating film covers the structure and the plurality of interconnects, and is in contact with the inorganic film between the plurality of interconnects.

2. The light emitting device according to claim 1, wherein the inorganic film is a film comprising silicon oxide.

3. The light emitting device according to claim 1, wherein the coating film is inorganic material comprising a silicon atom.

4. The light emitting device according to claim 1, further comprising a terminal located along at least a first side of the substrate, wherein the terminal is electrically connected to the interconnect.

5. The light emitting device according to claim 4, wherein the substrate comprises a second side different from the first side, and
   wherein the plurality of interconnects is located between an end portion of the coating film and the light emitting element in a direction from the second side toward the light emitting element as viewed from a surface side of the substrate at which the light emitting element is located.

6. The light emitting device according to claim 4, wherein the substrate comprises a second side different from the first side, and
   wherein an end portion of the coating film is located between the second side of the substrate and the plurality of interconnects in a cross sectional view perpendicular to a surface of the substrate over which the light emitting element is located.

7. The light emitting device according to claim 5, wherein the end portion of the coating film is in contact with the inorganic film.

8. The light emitting device according to claim 6, wherein the end portion of the coating film is in contact with the inorganic film.

* * * * *